(12) United States Patent
Bayan et al.

(10) Patent No.: US 6,372,539 B1
(45) Date of Patent: Apr. 16, 2002

(54) LEADLESS PACKAGING PROCESS USING A CONDUCTIVE SUBSTRATE

(75) Inventors: Jaime Bayan, Palo Alto; Peter Howard Spalding, Cupertino, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/528,540

(22) Filed: Mar. 20, 2000

(51) Int. Cl.$^7$ ............................................... H01L 21/44
(52) U.S. Cl. ..................... 438/106; 438/110; 438/124
(58) Field of Search ............................... 438/107, 121, 438/124, 110, 106, 108, 112

(56) References Cited

U.S. PATENT DOCUMENTS

| | | | |
|---|---|---|---|
| 3,838,984 A | * | 10/1974 | Crane et al. |
| 5,367,196 A | | 11/1994 | Mahulikar et al. |
| 5,494,207 A | | 2/1996 | Asanasavest |
| 5,508,556 A | | 4/1996 | Lin |
| 5,580,466 A | * | 12/1996 | Tada et al. |
| 5,596,231 A | | 1/1997 | Combs |
| 5,623,123 A | | 4/1997 | Umehara |
| 5,656,550 A | | 8/1997 | Tsuji et al. |
| 5,741,729 A | | 4/1998 | Selna |
| 5,844,315 A | | 12/1998 | Melton et al. |
| 5,854,511 A | | 12/1998 | Shin et al. |
| 5,866,948 A | | 2/1999 | Murakami et al. |
| 5,981,314 A | | 11/1999 | Glenn et al. |
| 5,990,545 A | | 11/1999 | Schueller et al. |
| 6,013,946 A | | 1/2000 | Lee et al. |
| 6,033,934 A | * | 3/2000 | Hsieh |
| 6,060,774 A | | 5/2000 | Terui |
| 6,060,778 A | | 5/2000 | Jeong et al. |
| 6,093,960 A | | 7/2000 | Tao et al. |
| 6,133,070 A | | 10/2000 | Yagi et al. |
| 6,177,288 B1 | | 1/2001 | Takiar |
| 6,182,359 B1 | * | 2/2001 | Nieto |
| 6,188,130 B1 | | 2/2001 | Ramirez et al. |

FOREIGN PATENT DOCUMENTS

| | | |
|---|---|---|
| GB | 2 059 157 A | 4/1981 |
| JP | 3-108745 | 5/1991 |

OTHER PUBLICATIONS

Leadless Leadframe Package (LLP), National Semiconductor Application Note 1187, Sep. 2000.

* cited by examiner

Primary Examiner—Caridad Everhart
(74) Attorney, Agent, or Firm—Beyer Weaver & Thomas, LLP

(57) ABSTRACT

Improved methods of packaging integrated circuits in leadless packages are disclosed. A conductive substrate sheet is initially patterned to form troughs that define a multiplicity of device areas. Each device area includes a plurality of contact landings (and preferably a die attach pad) that are formed in substrate sheet by patterning. The patterning can be done using a variety of conventional techniques including etching. A multiplicity of dice are then attached to the substrate sheet and bond pads on the dice are electrically connected to associated contact landings using conventional techniques such as wire bonding. One or more caps are then molded over the device areas to encapsulate the dice and bonding wires and to fill the troughs. After the caps have been formed, excess portions of the substrate sheet (e.g. portions below the troughs) are removed to electrically isolate the contact landings thereby forming electrically isolated independent contacts in a molded package. In the resulting arrangement, the molding material serves to hold the contacts in place as well as to electrically isolate the independent contacts. The excess substrate material can be removed using a variety of techniques including mechanical grinding and chemical etching and/or a combination of the two. In the described arrangement, the "excess" substrate material serves to prevent the formation of flash below the contacts during the molding operation. The "excess" substrate material also supports the die attach pad and the contacts during both wire bonding and the die attach process.

14 Claims, 6 Drawing Sheets

LEADLESS PACKAGING PROCESS USING A CONDUCTIVE SUBSTRATE

CROSS REFERENCE TO RELATED APPLICATIONS

This application is related to commonly assigned U.S. patent application Ser. Nos. 09/528,658, 09/528,539, 09/528,662 and 60/190,587 filed concurrently herewith, each of which are incorporated herein by reference.

BACKGROUND OF THE INVENTION

The present invention relates generally to the bulk packaging of integrated circuits. More particularly, the invention relates to the use of leadless packaging processes and designs that utilize a conductive substrate.

A leadless leadframe package (LLP) is a relatively new integrated circuit package design that contemplates the use of a metal (typically copper) leadframe type substrate structure in the formation of a chip scale package (CSP). As illustrated in FIG. 1, in typical leadless leadframe packages, a copper leadframe strip or panel 101 is patterned (typically by stamping or etching) to define a plurality of arrays 103 of chip substrate features 105. Each chip substrate feature includes a die attach pad 107 and a plurality of contacts 109 disposed about their associated die attach pad 107. Very fine tie bars 111 are used to support the die attach pads 107 and contacts 109.

During assembly, dice are attached to the respective die attach pads and conventional wire bonding is used to electrically couple bond pads on each die to their associated contacts 109 on the leadframe strip 101. After the wire bonding, a plastic cap is molded over the top surface of the each array 103 of wire bonded dice. The dice are then singulated and tested using conventional sawing and testing techniques.

FIG. 2 illustrates a typical resulting leadless leadframe package. The die attach pad 107 supports a die 120 which is electrically connected to its associated contacts 109 by bonding wires 122. A plastic cap 125 encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip can then be surface mounted on a printed circuit board or other substrate using conventional techniques.

Although leadless leadframe packaging has proven to be a cost effective packaging arrangement, there are continuing efforts to further improve the package structure and processing to reduce production costs, improve production efficiency and/or improve production yields.

SUMMARY OF THE INVENTION

To achieve the foregoing and other objects and according to the purpose of the present invention, an improved method of packaging integrated circuits in a leadless package is disclosed. A conductive substrate sheet is initially patterned to form troughs that define a multiplicity of device areas. Each device area includes a plurality of contact landings (and preferably a die attach pad) that are formed in the substrate sheet by patterning. The patterning can be done using a variety of conventional techniques (e.g. etching). A multiplicity of dice are then attached to the substrate sheet and bond pads on the dice are electrically connected to associated contact landings using conventional techniques such as wire bonding. The substrate sheet serves to support the contacts (and die attach pad) during the bonding. One or more caps are then molded over the device areas to encapsulate the dice and bonding wires and to fill the troughs. After the caps have been formed, excess portions of the substrate sheet (e.g. portions below the troughs) are removed to electrically isolate the contact landings thereby forming electrically isolated independent contacts in a molded package. In the resulting arrangement, the molding material serves to hold the contacts in place as well as to electrically isolate the independent contacts.

The excess substrate material can be removed using a variety of techniques including mechanical grinding and chemical etching and/or a combination of the two. It should be appreciated that in the described arrangement, the "excess" substrate material serves to prevent the formation of flash below the contacts during the molding operation. The "excess" substrate material also supports the die attach pad and the contacts during both wire bonding and the die attach process.

In an apparatus aspect of the invention, it is believed that the intermediate patterned substrate sheet is a novel structure and that the matrix based packaging of devices using such a substrate is also new.

BRIEF DESCRIPTION OF THE DRAWINGS

The present invention is illustrated by way of example, and not by way of limitation. In the figures of the accompanying drawings, like reference numerals are used to refer to similar elements.

DETAILED DESCRIPTION OF THE INVENTION

An improved method of forming leadless packages is described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As described in the background section, in conventional leadless leadframe packaging, the die attach pads and contacts are preformed in the leadframe strip or panel. In some processes, we have found it helpful to adhere an adhesive tape to the bottom surface of the leadframe strip or panel 101 during the assembly. The tape helps support the contacts 109 and die attach pads 107 during the die attach and wire bonding operations and also prevents flash (i.e. unwanted plastic) from forming on the underside of the leadframe strip or panel 101 during the molding process. In the present invention, a conductive substrate sheet (e.g., the copper leadframe sheet) itself is effectively used in place of the adhesive tape. This is accomplished by partially etching the desired leadframe features (e.g. the die attach pads and contacts) into the leadframe sheet, leaving the bottom portion of the sheet in place to serve as a substrate. The die attachment, wire bonding and molding operations and any related processing are done on the partially etched sheet. After the molding has been completed, the bottom portion of the sheet is etched or ground away thereby isolating the contacts from one another (and typically from the die attach pads as well).

Figure 3A:
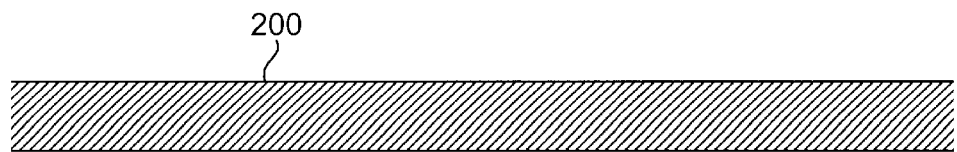
FIGS. 3(a)–3(g) are diagrammatic cross sectional side views illustrating steps involved in packaging an integrated circuit in accordance with one embodiment of the present invention.

Referring next to the sequence of FIGS. 3(a)–3(g), this process will be described in more detail. Initially, a substrate sheet 200 is provided as illustrated in FIG. 3(a). The substrate sheet is formed from a conductive material that is suitable for use as the package contacts. By way of example copper works well and is the material most commonly used in semiconductor packaging applications. However other materials such as aluminum and Alloy 42 may be used instead. The substrate sheet 200 may take any appropriate form factor. Today, much of the packaging handling equipment that is available is designed for handling leadframe strips and therefore, leadframe strips may be used as the substrate sheet. In the embodiment illustrated in FIG. 4, this type of substrate sheet 200 is used. Alternatively, in many respects metal panels (e.g. copper panels) are more appropriate since they will typically have better rigidity and facilitate better space utilization. The panels may take any form although substantially square or rectangular panels are expected to be the most common.

Figure 5:
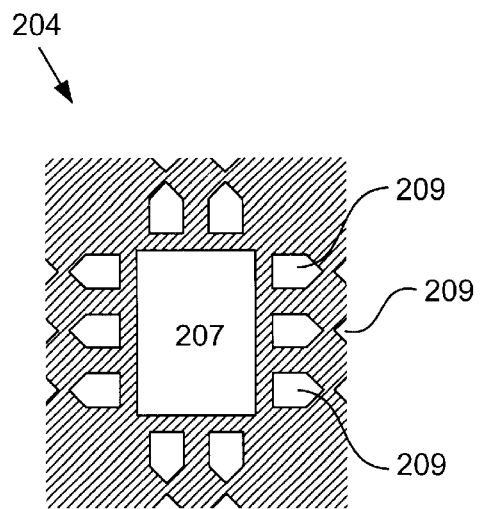
FIG. 5 is a diagrammatic top view the substrate features associated with a single one of the independent package areas illustrated in FIG. 4.
Figure 6A:
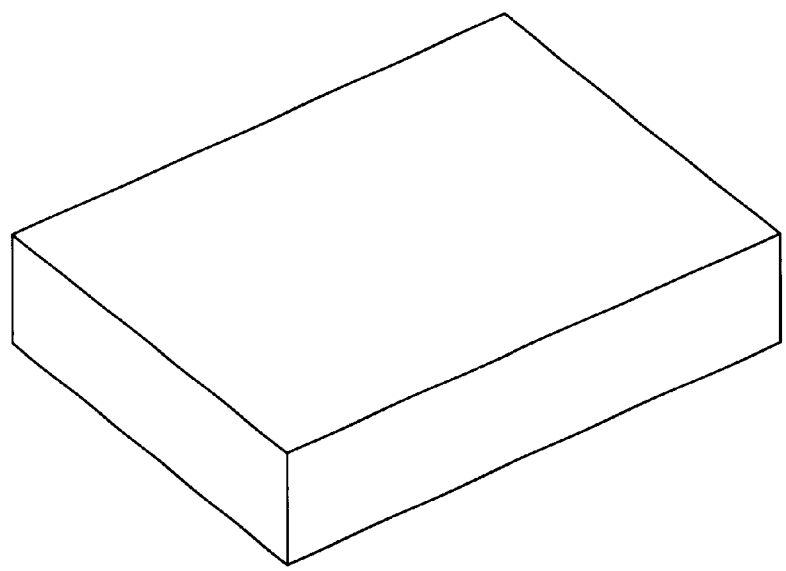
FIGS. 6(a) and 6(b) are perspective top and bottom views respectively of finalized packaged devices in accordance with one embodiment of the present invention.
Figure 6B:
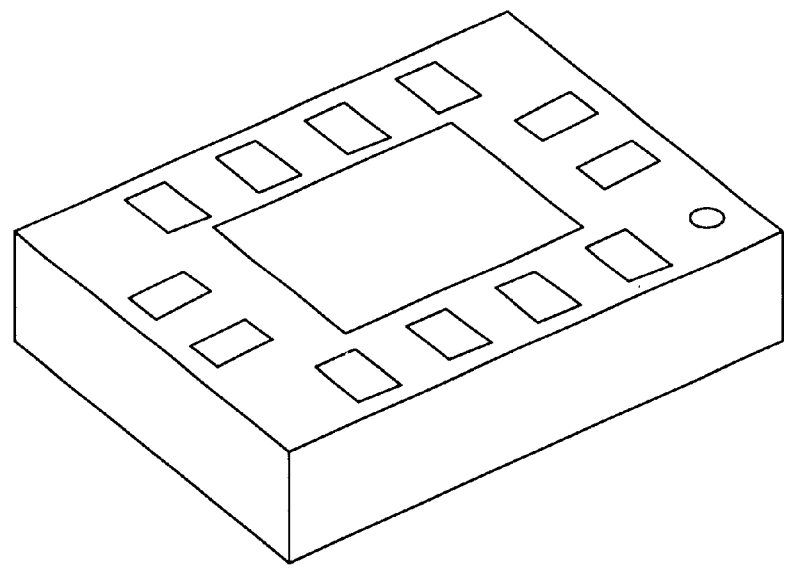

The panel 200 is initially patterned to define one or more arrays 202 of device areas 204 on the surface of the panel 200. Each device area 204 (illustrated in FIG. 5) has the appropriate surface features formed thereon. Typically, the desired surface features in each device area will include a plurality of contact landings 209 and a die attach pad 207 as best illustrated in FIGS. 3(b) and 5.

Figure 1A:
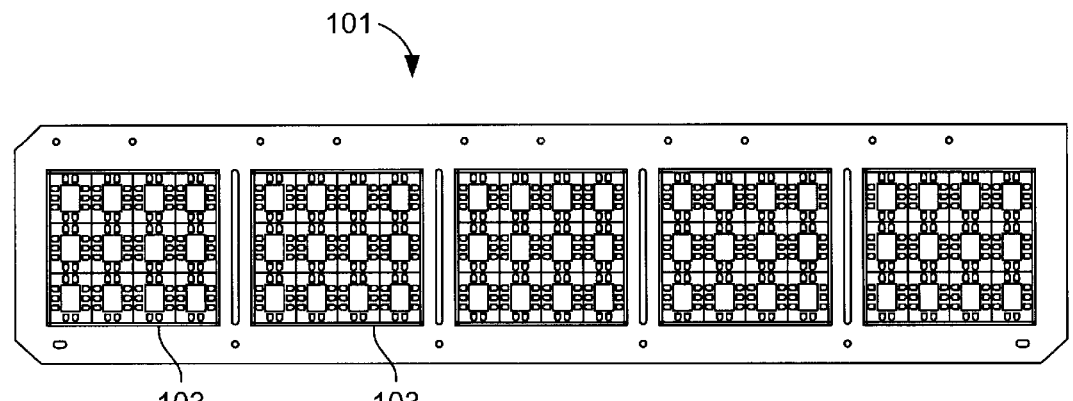
FIG. 1 is a diagrammatic top view of a conventional lead frame strip suitable for use in forming leadless leadframe packages.
Figure 1B:
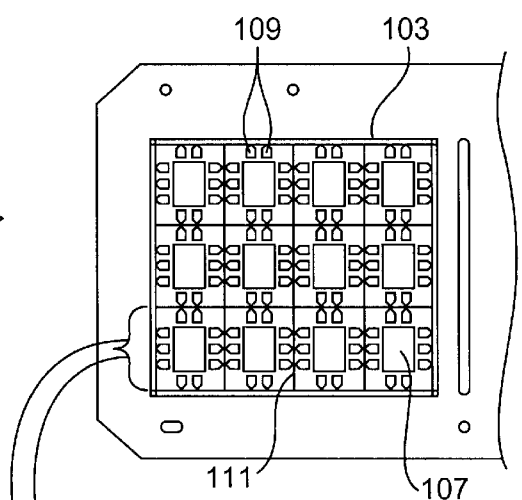
Figure 1C:
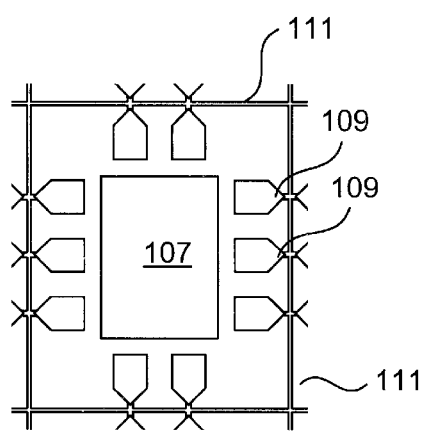
Figure 3B:
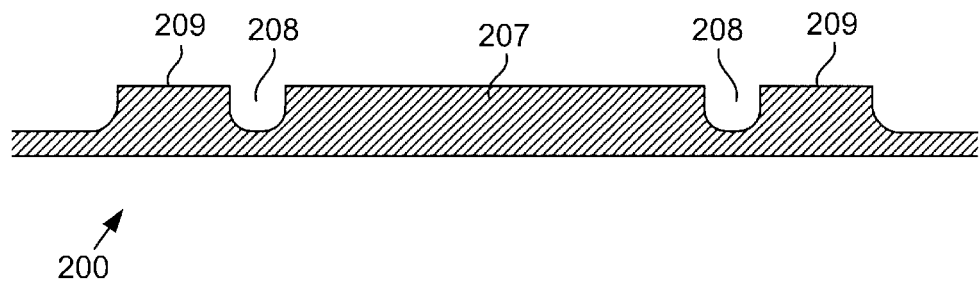
Figure 4:
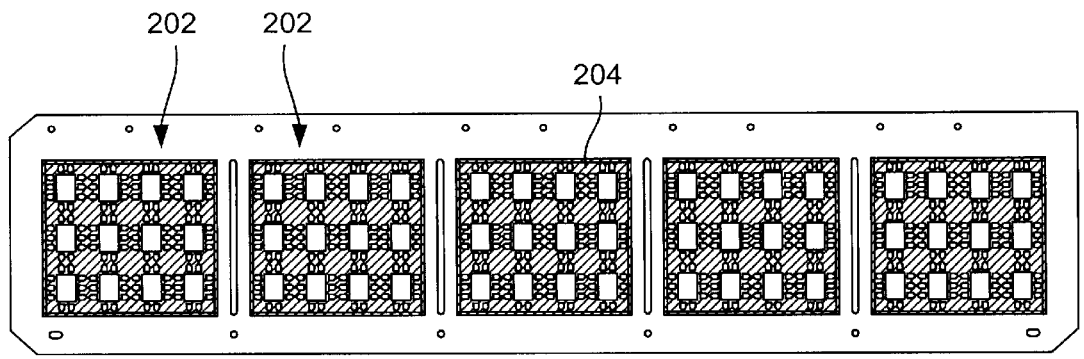
FIG. 4 is a diagrammatic top view of a substrate panel of FIG. 3(b) having a matrix of independent package areas.

As best seen in FIG. 3(b), troughs 208 are formed in the substrate sheet during the patterning to define the desired surface features. The troughs preferably extend a majority of the way through the substrate panel 200 but do not extend all of the way through the substrate panel. As suggested above, one advantage of this structure is that the panel remains intact and thereby support the die attach pads 207 and the contact landings 209 during further processing. It should be apparent that with this arrangement, there is no need to provide separate tie bars to support the die attach ads and/or contacts as required in the conventional arrangement illustrated in FIG. 1.

The troughs may be formed by any suitable process. This is sometimes referred to herein as a half etch or partial etch process since the etch is intended to form troughs in the substrate rather than etch completely through the substrate panel 200. A wide variety to conventional etching techniques can be used to facilitate the etching. In one specific example a photo-lithographic based etch process may be used. However, it should be apparent that the techniques, chemistries and or processes used to etch (or grind or otherwise form) the troughs can be widely varied within the scope of the present invention.

The depth of the troughs may be widely varied and will typically depend on a number of factors including the substrate strength desired during later processing, the desired thickness of the resultant packages and the process controls of the etching process used to form the troughs. In most implementations, it is expected that the depth of troughs will be greater than 50% of the thickness of the substrate. By way of example, trough depths in the range of 70–80% or more of the thickness of the substrate work suitable in substrates having a thickness in the range of 6–10 mils.

As pointed out above, the panel 200 is initially patterned to define one or more arrays 202 of device areas 204 on the surface of the panel 200. Each device area 204 (illustrated in FIG. 5) has the appropriate surface features formed thereon. In the embodiment illustrated in FIG. 4, four arrays are illustrated in a strip type substrate panel 200. It should be appreciated that the number of arrays provided in any particular substrate panel and the number of device areas in each array may be very widely varied in accordance with the needs, constraints and optimizations of the particular manufacturing process. Typically, the desired surface features in each device area will include a plurality of contact landings 209 and a die attach pad 207 as best illustrated in FIGS. 3(b) and 5.

In the illustrated embodiment, the patterning includes defining die attach pads 207. In some instances, it may be desirable to effectively thin or even eliminate the die attach pads so that the dice sit lower in the package relative to the top surface of the contacts 209. This can readily be done by either etching the region that the dice will be attached to either the fill depth of the troughs (to eliminate the die attach pads) or to a portion of the depth of the troughs (to provide reduced height die attach pads). One advantage of this approach is that it may reduce the inductance of the packaged device. This arrangement is more fully discussed in concurrently filed, copending Application No. 09/528,662 which is incorporated herein by reference.

Figure 3C:
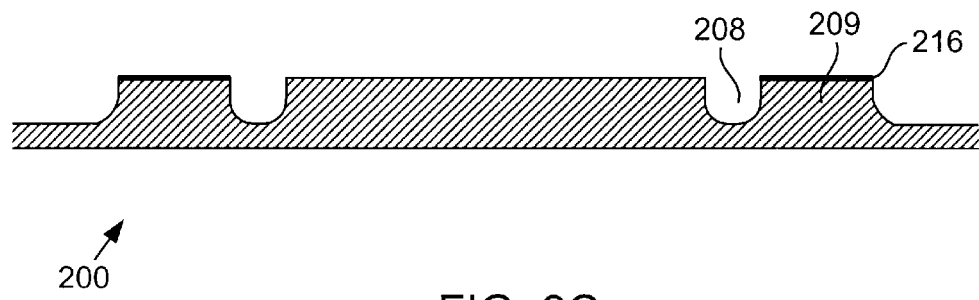

After the substrate panel 200 has been patterned, it may optionally be plated with a material 216 that facilitates better wire bonding as illustrated in FIG. 3(c) and described below. In the described embodiment, only the contact landings 209 are selectively plated in order to save material. A variety of plating materials may be used. In the described embodiment, silver plating is used since as is well known to those skilled in the art, the gold bonding wires bond better with the silver plating than a copper substrate. In other embodiments alternative materials such as palladium-nickel (PdNi) are plated to onto the contact pads to facilitate bonding. Of course, the actual plating materials used may be widely varied and a number of suitable materials are commercially available.

Figure 3D:
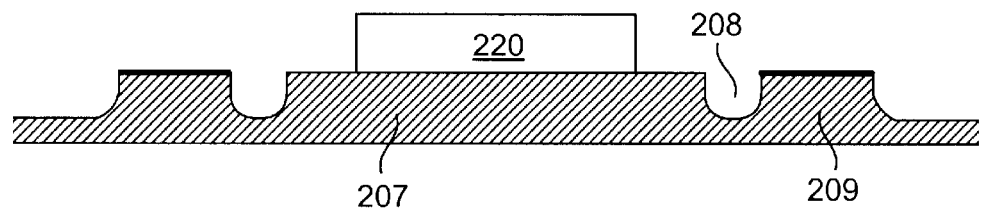
Figure 3E:
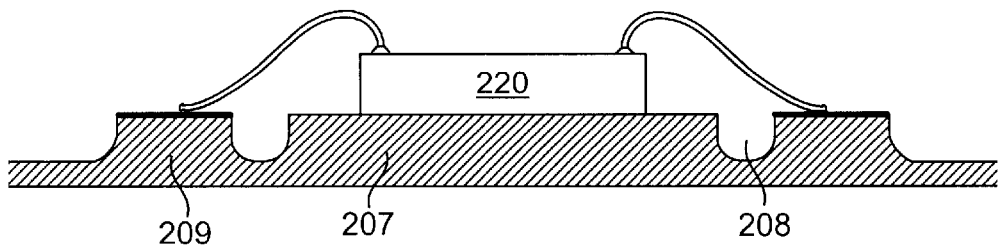

After any desired plating has been done, dice 220 are mounted on the die attach pads 207 using conventional die attachment techniques as illustrated in FIG. 3(d). Thereafter bond pads 221 the dice 220 are then electrically connected to associated ones of the contact landings 209. In the embodiment shown wire bonding is used to electrically connect the dice to their associated contact landings. Thus, as illustrated in FIG. 3(e), bonding wires 222 electrically couple the dice 220 to the contact landings 209. As suggested above, bonding wires are typically formed from gold. When gold bonding wires 222 are used in combination with a copper substrate, it is advantageous to silver (or otherwise) plate to contact landings 209 to improve the adhesion of the bonding wires to the landings.

Figure 3F:
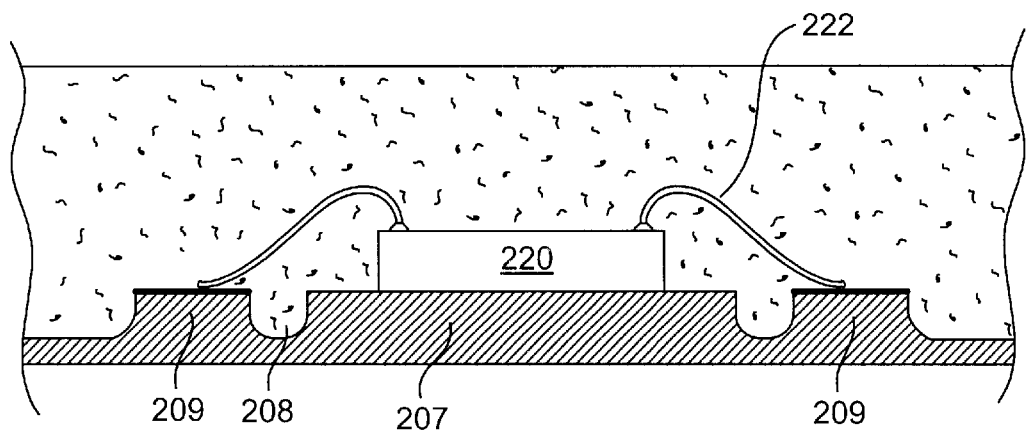

After all of the dice have been wire bonded or otherwise electrically connected to the appropriate contact landings, one or more plastic caps 225 are formed over the substrate panel 200 as illustrated in FIG. 3(f). In the described embodiment, a separate plastic cap is formed over each separate array 202 of device areas 204. That is, four separate caps as outlined in dashed lines in FIG. 4. However, it should be appreciated that a single cap or a different number of caps can readily be provided.

As will be appreciated by those skilled in the art, one potential disadvantage to having a single very large cap 225 that covers a large array on a single large panel is that the cap may induce stresses which adversely affect the dice. Thus, when molding over large panels it is common to logically separate the panel into a plurality of regions (e.g. the separate arrays) in order to reduce the impact of such induced stresses. However, it should be apparent that when the component design parameters and molding process control permits, a single cap may be provided.

In other embodiments, a relatively larger number of caps 225 may be molded over the surface of the substrate panel. One drawback of having too many caps is that in order to form separate caps, a greater spacing is required between adjacent device areas 204 that are under different caps than would be required for adjacent device areas 204 under the same cap. Thus, the density of devices that can be packaged on a particular substrate panel is reduced.

The caps 225 may be formed using any conventional molding process including transfer molding and injection molding. In the described embodiment, a molded array type transfer molding process is used.

Figure 3G:
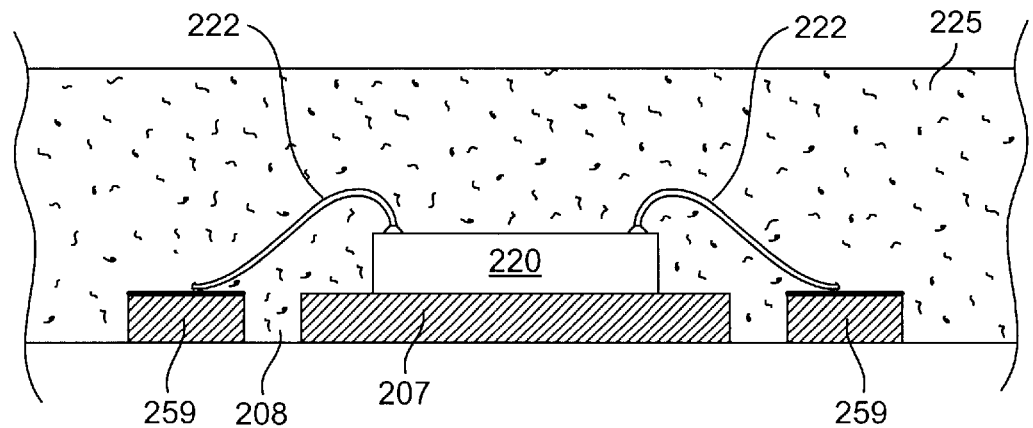

After the caps 225 have been formed, the back surface of the substrate 200 is thinned to expose the troughs 208 as illustrated in FIG. 3(g). This effectively electrically isolates the contact landings 209 from one another thereby forming independent contacts 259. It also electrically isolates the die attach pad 207 from the contacts 259. The thinning can be accomplished by any suitable mechanism. By way of example, mechanical grinding, chemical etching and/or a combination of the two work well. The amount of substrate material removed during the thinning process can be widely varied. However, typically it will be primarily dependent on the depth of the troughs and the tolerances of the trough forming and thinning processes.

In some (presumably rare) embodiments, it may be desirable to maintain electrical connections between specific ones of the contacts 259 and/or between the die attach pad 207 and a particular one or more of the contacts 259. This can be facilitated by eliminating or controlling the depth of the troughs in the regions that are to be electrically connected.

After the substrate panel 202 has been thinned, any additional process steps that are desired may be performed. As will be appreciated by those skilled in the art, these may include solder plating the exposed surfaces of the contacts 259 and singulating the packaged integrated circuits.

Figure 2:
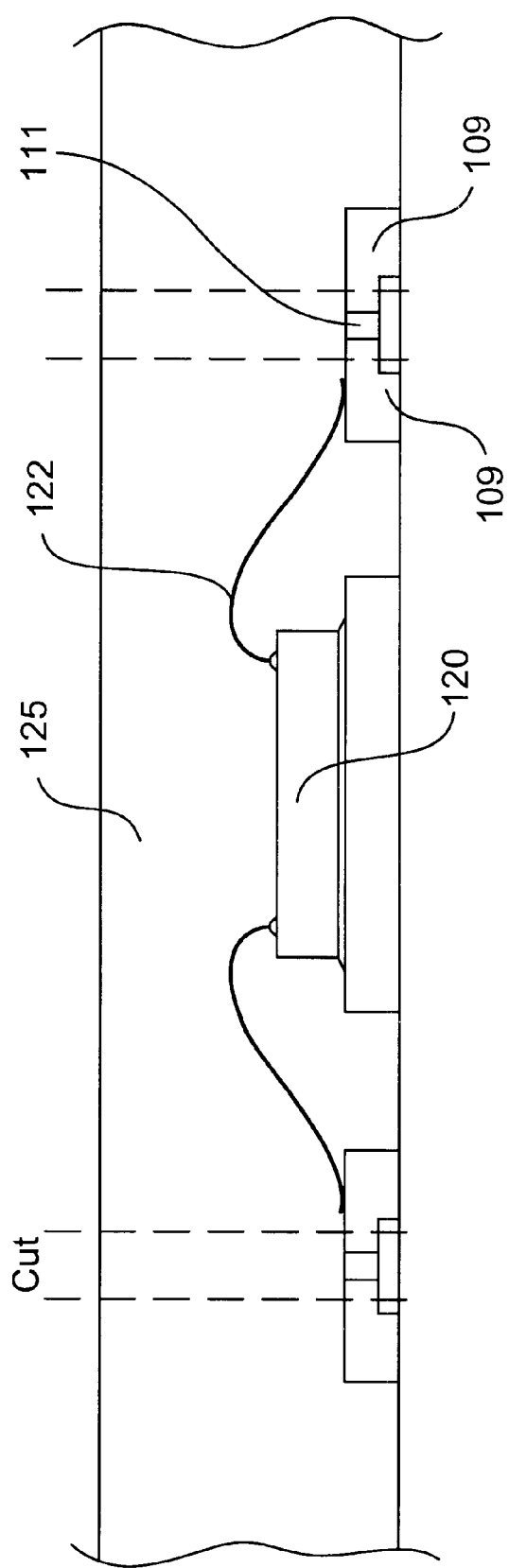
FIG. 2 is a diagrammatic cross sectional side view of a conventional leadless leadframe package.

Typically it is desirable to test the packaged integrated circuits after they have been packaged to make sure that the devices were not damaged during the packaging and that they work for their intended purposed. Conventionally, in leadless leadframe packaging (LLP), the dice must be singulated before testing. This is because the tie bars illustrated in FIGS. 1 and 2 electrically connect the contacts when the leadframe based substrate strip is intact. More specifically, the tie bars are conventionally only eliminated (and thus the electrical connections between adjacent contacts severed), during the singulation process.

In contrast in the arrangement described with reference to FIGS. 3(a)–3(g), the contacts 259 are electrically isolated when the substrate panel 200 is thinned. Therefore, the devices can be tested in panel form (i.e. before the packaged devices are singulated). This is a significant advantage for the described process since it is far more cost effective to test in panel form than on an individual basis.

Although the foregoing invention has been described in some detail for purposes of clarity of understanding, it will be apparent that certain changes and modifications may be practiced within the scope of the appended claims. For example, a number of conventional package processing techniques have been described as being used in the formation of the described devices. It should be apparent that in most cases these processing techniques can be widely varied and a wide variety of alternative conventional processes may be used in their place. Accordingly, the present embodiments are to be considered as illustrative and not restrictive, and the invention is not to be limited to the details given herein, but may be modified within the scope and equivalents of the appended claims.

What is claimed is:

1. A method of packaging integrated circuits comprising:

patterning a conductive substrate sheet formed from a conductive material to define a multiplicity of device areas, each device area including a plurality of contact landings formed from the substrate sheet, wherein the patterning define troughs in the substrate sheet that separate the contact landings;

attaching a multiplicity of dice to the substrate sheet, each die having a plurality of associated bond pads;

electrically connecting the bond pads on the dice to their associated contact landings;

molding at least one cap over the device areas to encapsulate the dice and to fill at least some of the troughs; and bulk removing excess portions of the substrate sheet to electrically isolate the contact landings thereby exposing molding material segments between the contact landings that are substantially co-planar with remaining exposed portions of the contact landings, thereby forming electrically isolated independent contacts in a molded package wherein the molding material serves to hold the contacts in place and electrically isolate the independent contacts.

2. A method as recited in claim 1 wherein:

the patterning of the conductive sheet further defines a die attach pad in each device area; and each die is attached to an associated die attach pad on the substrate sheet.

3. A method as recited in claim 1 wherein the bond pads are electrically connected to their associated contact landings by bonding wires and wherein the molding material further encapsulates the bonding wires.

4. A method as recited in claim 1 wherein the excess portions of the substrate sheet are removed at least in part by mechanical grinding.

5. A method as recited in claim 1 wherein the excess portions of the substrate sheet are removed at least in part by chemical etching.

6. A method as recited in claim 1 further comprising plating the contact landings with a material that bonds better with the bonding wires than the material that forms the substrate sheet.

7. A method as recited in claim 1 wherein the excess portions of the substrate sheet is a solid volume including an exposed surface of said sheet; and said volume are removed by mechanical grinding.

8. A method as recited in claim 1 wherein the excess portions of the substrate sheet is a solid volume including an exposed surface of said sheet; and said volume are removed by chemical etching.

9. A method of packaging integrated circuits comprising:

patterning a substrate sheet formed from a conductive material to define a multiplicity of device areas, each device area including a plurality of contact landings formed from the substrate sheet, wherein the patterning define troughs in the substrate sheet that separate the contact landings;

attaching and electrically connecting a multiplicity of dice to the substrate sheet such that each die is electrically connected to associated contact landings on the substrate sheet;

molding at least one cap over the device areas to encapsulate the dice; and bulk removing excess portions of the substrate sheet to electrically isolate the contact landings thereby exposing molding material segments between the contact landings that are substantially co-planar with remaining exposed portions of the contact landings, thereby forming electrically isolated independent contacts in a molded package wherein the molding material serves to hold the contacts in place.

10. A method as recited in claim 9 wherein the excess portions of the substrate sheet is a solid volume including an exposed surface of said sheet; and said volume are removed by mechanical grinding.

11. A method as recited in claim 9 wherein the excess portions of the substrate sheet is a solid volume including an exposed surface of said sheet; and said volume are removed by chemical etching.

12. A method of packaging integrated circuits comprising:

patterning a conductive substrate sheet formed from a conductive material to define a multiplicity of device areas, each device area including a die attach area and a plurality of contact landings formed from the substrate sheet, wherein the patterning define troughs in the substrate sheet that separate the contact landings;

attaching a multiplicity of dice to the substrate sheet, each die being attached to an associated die attach pad and having a plurality of associated bond pads;

wire bonding to electrically connecting the bond pads on the dice to their associated contact landings;

molding at least one cap over the device areas to encapsulate the dice and bonding wires and to fill at least some of the troughs; and bulk removing excess portions of the substrate sheet to electrically isolate the contact landings thereby exposing molding material segments between the contact landings that are substantially co-planar with remaining exposed portions of the contact landings, thereby forming electrically isolated independent contacts in a molded package wherein the molding material serves to hold the contacts in place and electrically isolate the independent contacts, wherein the excess portions of the substrate sheet are removed at least in part by one of mechanical grinding and chemical etching.

13. A method as recited in claim 12 wherein the excess portions of the substrate sheet is a solid volume including an exposed surface of said sheet; and said volume are removed by mechanical grinding.

14. A method as recited in claim 12 wherein the excess portions of the substrate sheet is a solid volume including an exposed surface of said sheet; and said volume are removed by chemical etching.

* * * * *